(12) United States Patent
Goebel et al.

(10) Patent No.: US 8,822,324 B2
(45) Date of Patent: Sep. 2, 2014

(54) PASSIVATED COPPER CHIP PADS

(71) Applicant: Infineon Technologies AG, Neubiberg (DE)

(72) Inventors: Thomas Goebel, Munich (DE); Erdem Kaltalioglu, Newburgh, NY (US); Markus Naujok, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/854,321

(22) Filed: Apr. 1, 2013

(65) Prior Publication Data

US 2013/0224946 A1    Aug. 29, 2013

Related U.S. Application Data

(62) Division of application No. 12/029,127, filed on Feb. 11, 2008, now abandoned.

(51) Int. Cl.
*H01L 21/44* (2006.01)
*H01L 21/768* (2006.01)
*H01L 23/00* (2006.01)

(52) U.S. Cl.
CPC . *H01L 21/76885* (2013.01); *H01L 2924/30105* (2013.01); *H01L 2924/01051* (2013.01); *H01L 2924/01024* (2013.01); *H01L 2924/01023* (2013.01); *H01L 2924/01022* (2013.01); *H01L 24/10* (2013.01); *H01L 2924/01082* (2013.01); *H01L 2924/01074* (2013.01); *H01L 2924/01322* (2013.01); *H01L 2924/01047* (2013.01); *H01L 2924/01078* (2013.01); *H01L 2224/13099* (2013.01); *H01L 2924/01019* (2013.01); *H01L 2224/16* (2013.01); *H01L 2924/01013* (2013.01); *H01L 2924/01029* (2013.01); *H01L 2924/04941* (2013.01); *H01L 2924/30107* (2013.01); *H01L 2924/01033* (2013.01); *H01L 2924/01006* (2013.01); *H01L 2924/01079* (2013.01); *H01L 2924/04953* (2013.01); *H01L 2924/01073* (2013.01)

USPC ..... 438/612; 438/613; 438/627; 257/E21.508

(58) Field of Classification Search
USPC ........... 438/612, 613, 614, 627; 257/E21.508
See application file for complete search history.

(56) References Cited

U.S. PATENT DOCUMENTS

| | | | |
|---|---|---|---|
| 5,514,622 A | 5/1996 | Bornstein et al. | |
| 5,654,589 A | 8/1997 | Huang et al. | |
| 5,903,058 A | 5/1999 | Akram | |
| 6,043,429 A | 3/2000 | Blish, II et al. | |
| 6,426,556 B1 | 7/2002 | Lin | |
| 6,458,683 B1 | 10/2002 | Lee | |
| 6,521,996 B1 | 2/2003 | Seshan | |
| 6,667,230 B2 | 12/2003 | Chen et al. | |
| 6,703,069 B1 | 3/2004 | Moon et al. | |
| 6,730,982 B2 | 5/2004 | Barth et al. | |
| 6,878,465 B2 | 4/2005 | Moon et al. | |
| 2005/0067388 A1 | 3/2005 | Sun et al. | |
| 2006/0091541 A1 | 5/2006 | Bojkov et al. | |
| 2006/0105534 A1 | 5/2006 | Edelstein et al. | |
| 2006/0163734 A1 | 7/2006 | Thei et al. | |
| 2006/0183259 A1 | 8/2006 | Lai et al. | |
| 2007/0023928 A1 | 2/2007 | Kuechenmeister et al. | |
| 2007/0295786 A1 | 12/2007 | Tago et al. | |
| 2008/0023827 A1 | 1/2008 | Farooq et al. | |
| 2008/0169539 A1 | 7/2008 | Fang et al. | |
| 2008/0194095 A1 | 8/2008 | Daubenspeck et al. | |

*Primary Examiner* — Hoai V Pham
(74) *Attorney, Agent, or Firm* — Slater & Matsil, L.L.P.

(57) ABSTRACT

A structure and method of forming passivated copper chip pads is described. In various embodiments, the invention describes a substrate that includes active circuitry and metal levels disposed above the substrate. A passivation layer is disposed above a last level of the metal levels. A conductive liner is disposed in the sidewalls of an opening disposed in the passivation layer, wherein the conductive liner is also disposed over an exposed surface of the last level of the metal levels.

18 Claims, 10 Drawing Sheets

PASSIVATED COPPER CHIP PADS

This is a divisional application of U.S. application Ser. No. 12/029,127, entitled "Passivated Copper Chip Pads," filed on Feb. 11, 2008 and is incorporated herein by reference.

THE NAMES OF THE PARTIES TO A JOINT RESEARCH AGREEMENT

This invention was made under a joint research agreement between Infineon Technologies AG and International Business Machines Corporation

TECHNICAL FIELD

This invention relates generally to electronic devices, and more particularly to passivated copper chip pads.

BACKGROUND

A flip chip package includes a direct electrical connection of face down ("flipped") semiconductor components onto substrates or carriers, such as ceramic substrates, or circuit boards. The flip chip semiconductor components are predominantly semiconductor devices, however, components such as passive filters, detector arrays, and MEM devices are also being used in flip chip form. The use of flip chip packaging has dramatically grown as a result of the flip chips advantages in size, performance, flexibility, reliability, and cost over other packaging methods and from the widening availability of flip chip materials, equipment and services.

Flip chips are advantageous because of their high-speed electrical performance, when compared to other assembly methods. For example, eliminating bond wires reduces the delay in inductance and capacitance of the connection, and substantially shortens the current path resulting in a high speed off-chip interconnection. Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips are amenable to 3-D integration by stacking over other flip chips or other components.

For almost 25 years, the semiconductor industry has rolled out a new generation of technology that has delivered improved performance at lower costs. One of the challenges faced in semiconductor manufacturing relates to reduction in process costs with each subsequent technology generation. Consequently, packaging processes also need to reduce fabrication costs with each technology generation. Hence, what are needed in the art are improved structures and methods for producing flip chip packages at lower costs.

SUMMARY OF THE INVENTION

These and other problems are generally solved or circumvented, and technical advantages are generally achieved, by embodiments of the present invention which provide flip chip and methods of manufacture thereof.

Embodiments of the invention include methods and structures of passivated copper chip pads. In accordance with an embodiment of the present invention, the structure includes a substrate comprising active circuitry, and metal levels disposed above the substrate. A passivation layer is disposed above a last level of the metal levels. A conductive liner is disposed in the sidewalls of a trench disposed in the passivation layer, wherein the conductive liner is also disposed over an exposed surface of the last level of the metal levels.

The foregoing has outlined rather broadly the features of an embodiment of the present invention in order that the detailed description of embodiments of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3, which includes

FIG. 5, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely formation and design of flip chip packaging. The invention may also be applied, however, to other semiconductor components comprising, for example, other packaging such as wirebond packaging, embedded wafer level packaging, and ball grid array packaging. One of ordinary skill in the art will be able to recognize further examples as well.

Formation of flip chip packaging requires use of many lithographic steps for formation of the different levels of the package. This requires the use of expensive masks and lithography tools that increase the cost of the process. In various embodiments, the present invention overcomes these limitations by reducing the number of mask steps or number of masks needed in the fabrication of flip chips packages. Various embodiments of the invention achieve this by avoiding pad metallization or formation of chip bonding pads over the last metal level. Avoiding this process eliminates mask steps not only in their formation, but also mask steps in forming passivation layers above these chip bonding pads.

Figure 2:
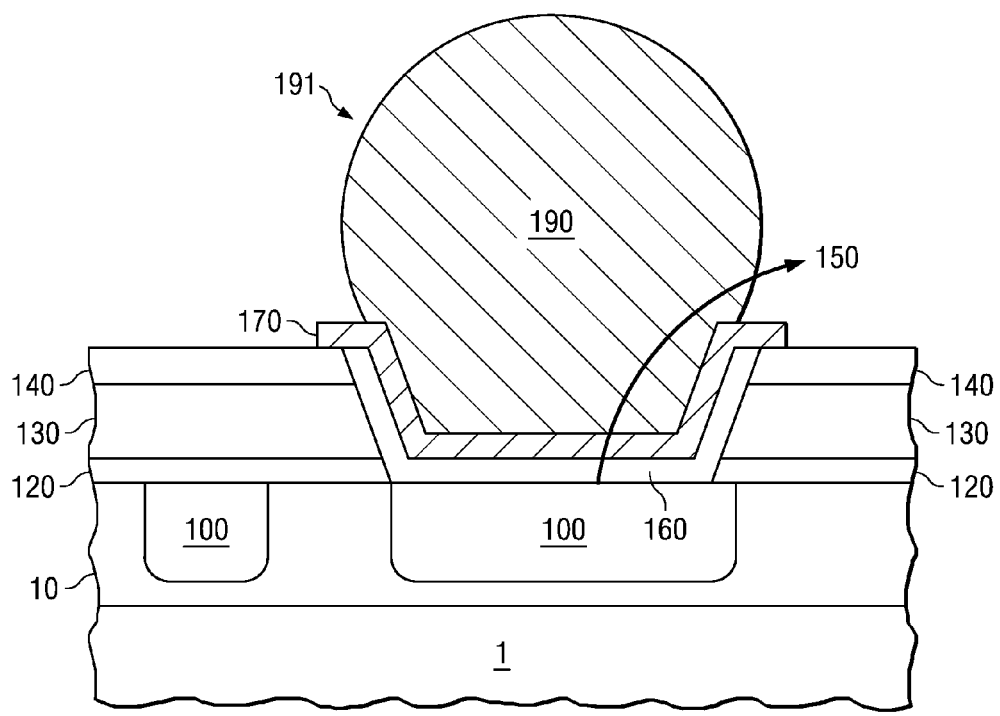
FIG. 2 illustrates an embodiment of a chip with a flip chip package.

A structural embodiment of the invention will be first described using FIG. 2. Various embodiments of the method of fabrication will then be described using the flow charts of FIGS. 4 and 6, and Figures and 3 and 5.

Figure 1:
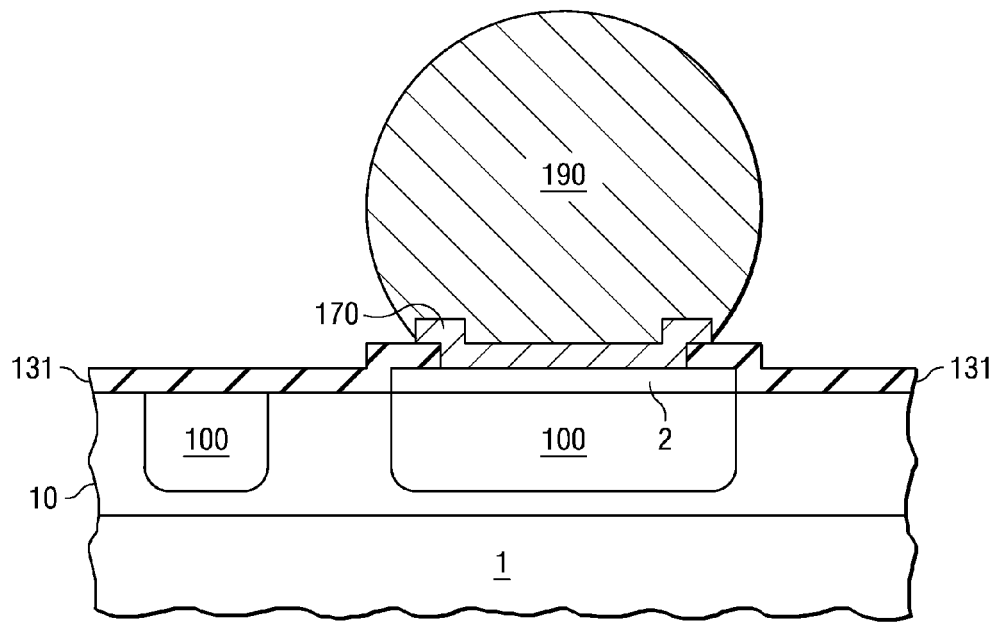
FIG. 1 illustrates a chip with a flip chip package.

FIG. 1 illustrates a conventional structure comprising an aluminum pad metallization 2 disposed on a substrate 1. The aluminum pad metallization 2 (also called the chip bonding pad) is disposed above, for example, a last metal line 100 from the last level of metallization, the last metal line 100 being disposed in a dielectric layer 10. A passivation layer 131 covers the last metal level 100 and a portion of an exposed top surface of the aluminum pad metallization 2 to form a via over the aluminum pad metallization 2. The via forms a pad opening for subsequent formation of a solder ball 190. An under bump metallization layer 170 is disposed above the passivation layer 131. A solder ball 190 is disposed above the under bump metallization layer 170.

An embodiment of the invention is illustrated in FIG. 2. The substrate 1 includes a dielectric layer 10. The substrate 1 may be a wafer such as a silicon wafer or other substrates such as a Ge wafer, SOI wafer, or <110> Si on <100> Si substrate. A last metal line 100 from the last level of metallization is embedded in the dielectric layer 10. A cap layer 120 is disposed above the last metal line 100 and the dielectric layer 10. The cap layer 120 comprises an insulating material. A passivation layer 130 is disposed above the cap layer 120. The passivating layer 130 comprises an insulating material. An optional insulating liner 140 is disposed above the passivation layer 130. A trench 150 is disposed in the stack comprising the cap layer 120, the passivation layer 130, and the optional insulating liner 140. A conductive liner 160 is disposed above and on the last metal line 100. The conductive liner 160 also is disposed on the sidewalls of the trench 150. A under bump metallization layer (UBM) layer 170 is disposed on the conductive liner 160. A solder ball 190 is disposed on the under bump metallization layer 170. Compared to prior art, embodiments of the invention do not use chip bonding pads (aluminum pad metallization 2 in FIG. 1). Rather, the UBM layer 170 directly contacts the last level of metallization passivated by the conductive liner 160.

Figure 3A:
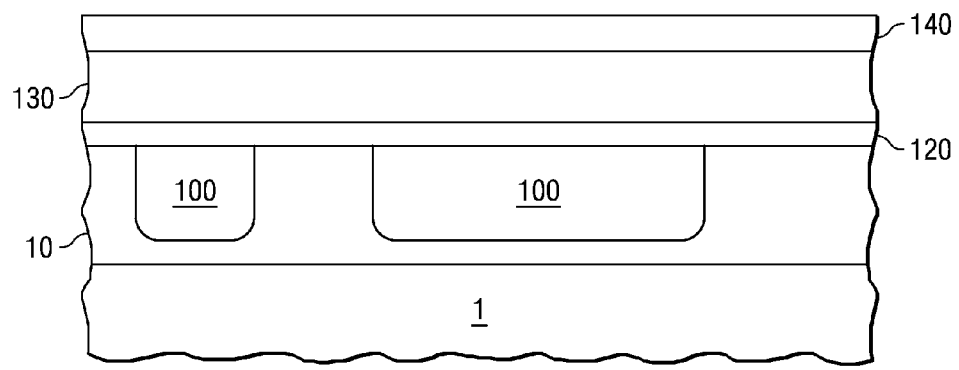
FIGS. 3a-3k, illustrates a flip chip package at various stages of fabrication, in embodiments of the present invention.
Figure 3B:
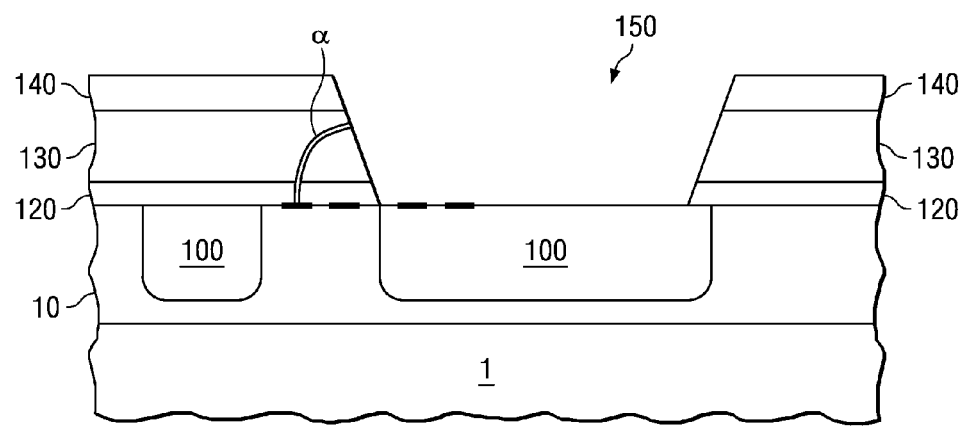
Figure 3C:
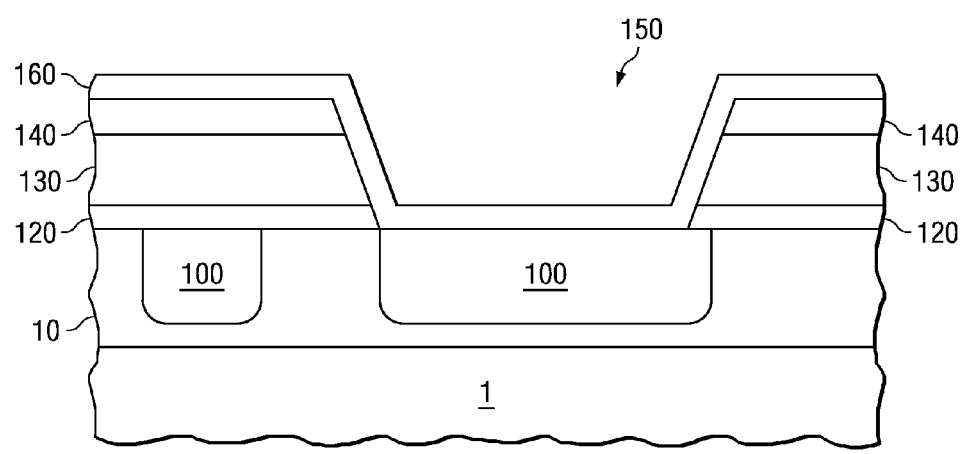
Figure 3D:
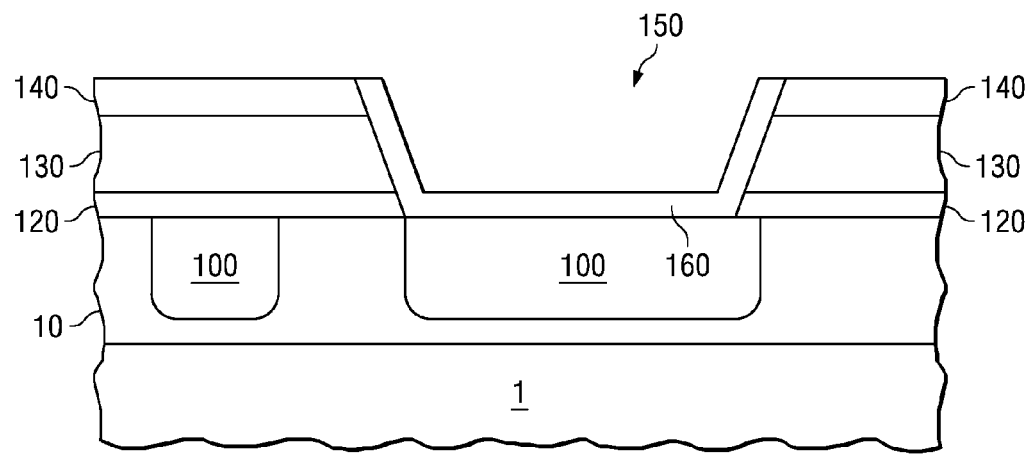
Figure 3E:
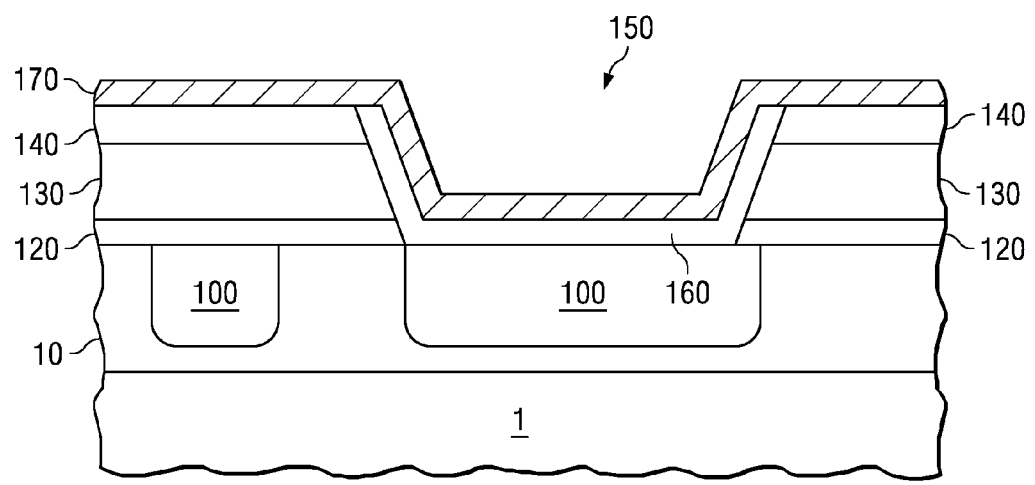
Figure 3F:
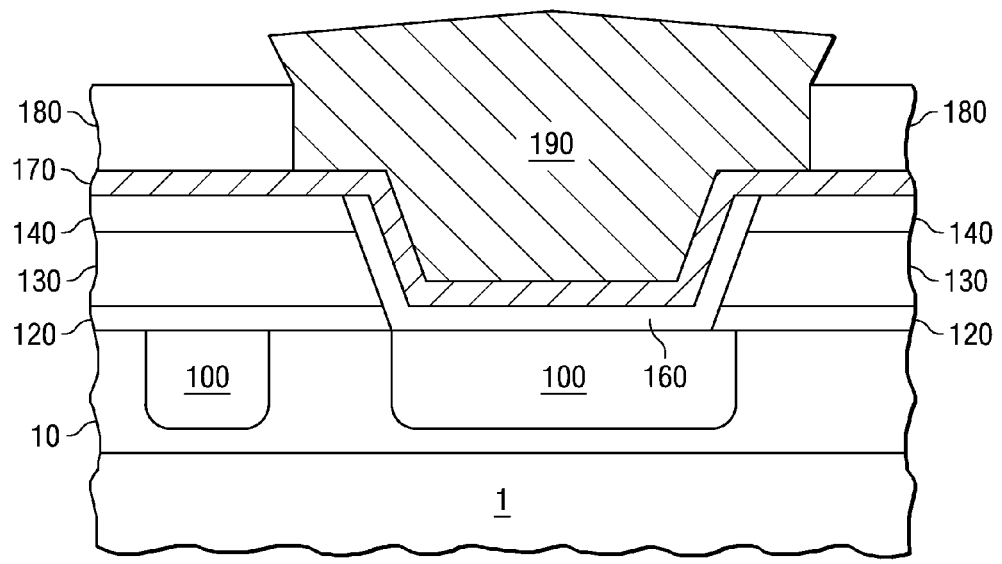
Figure 3G:
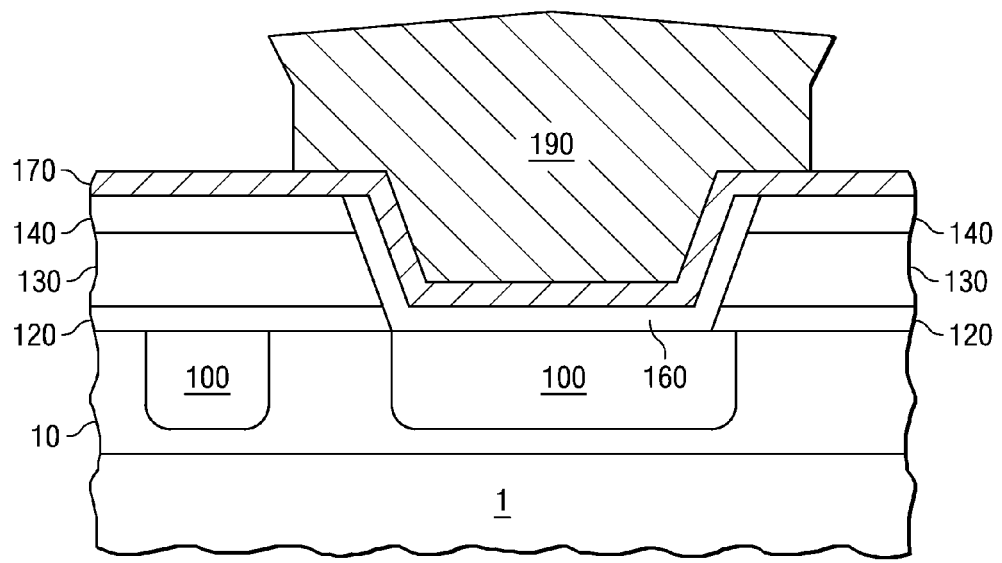
Figure 3H:
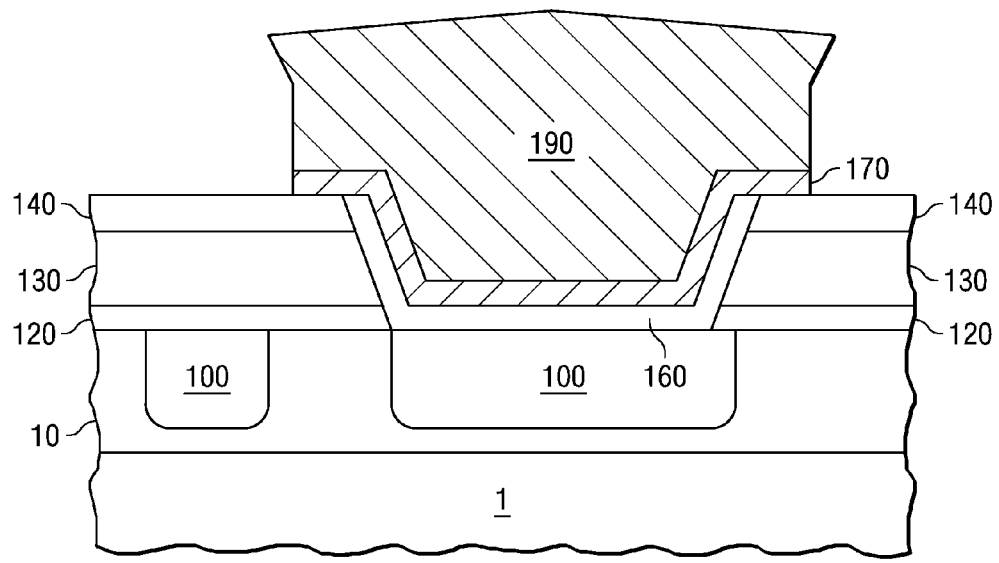
Figure 3I:
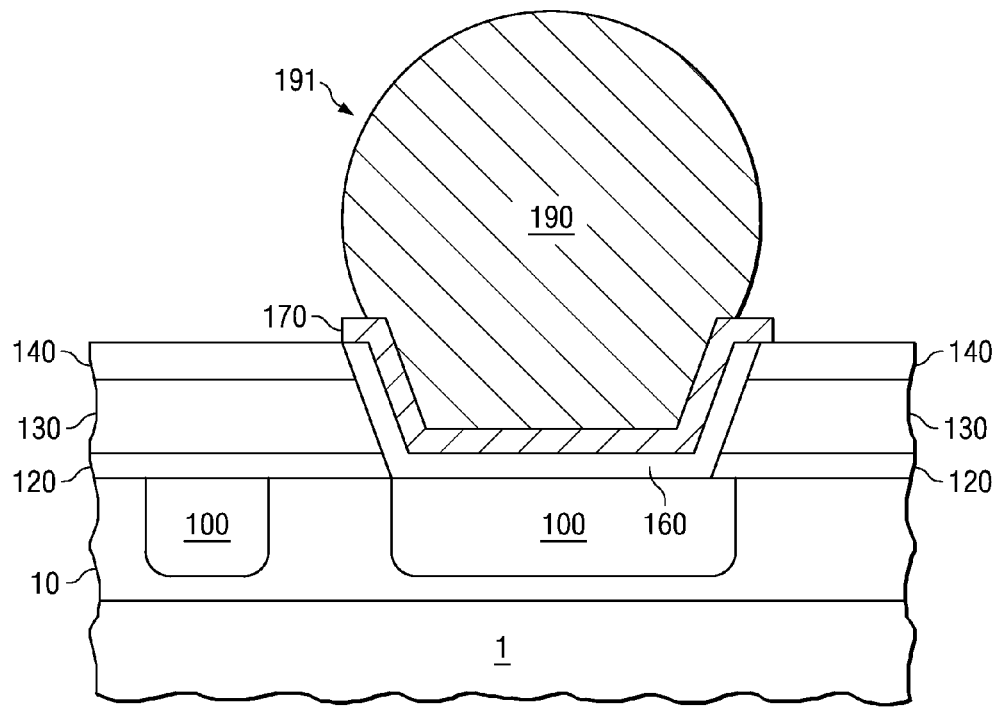
Figure 3J:
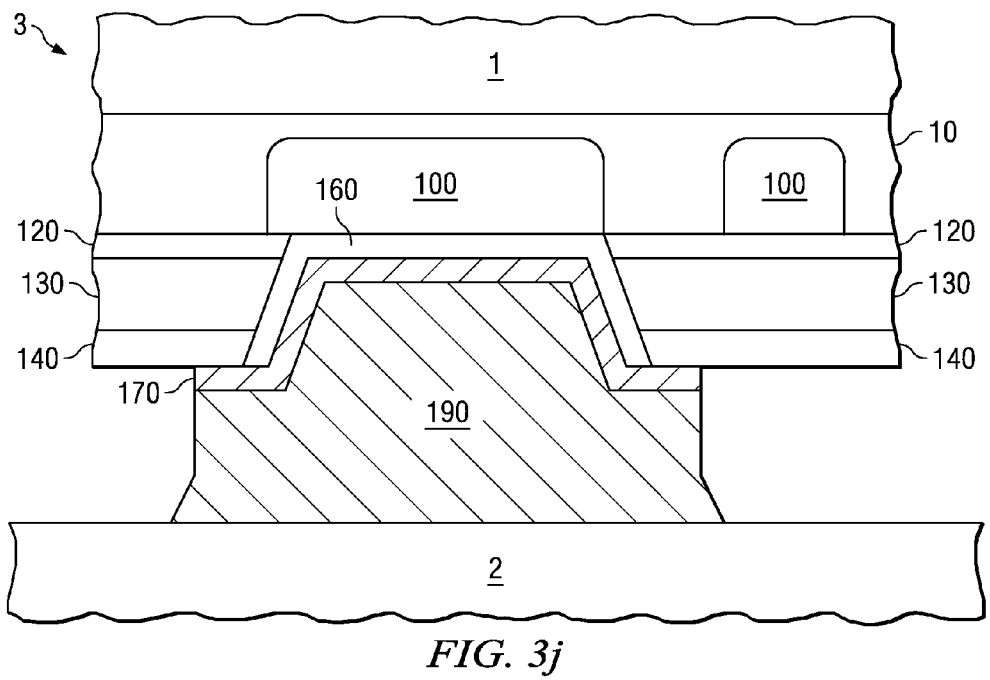
Figure 3K:
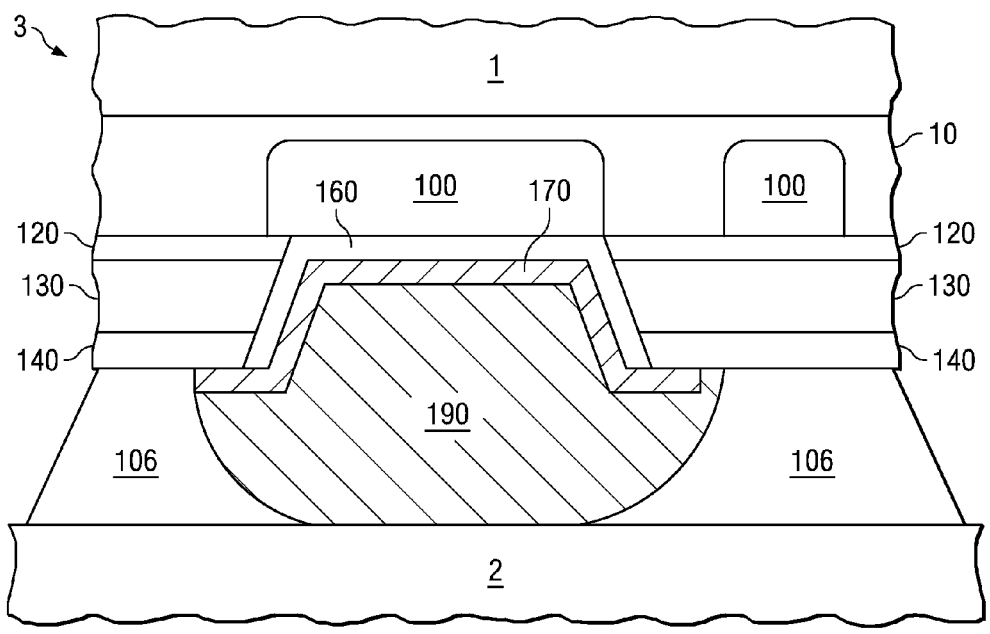
Figure 4:
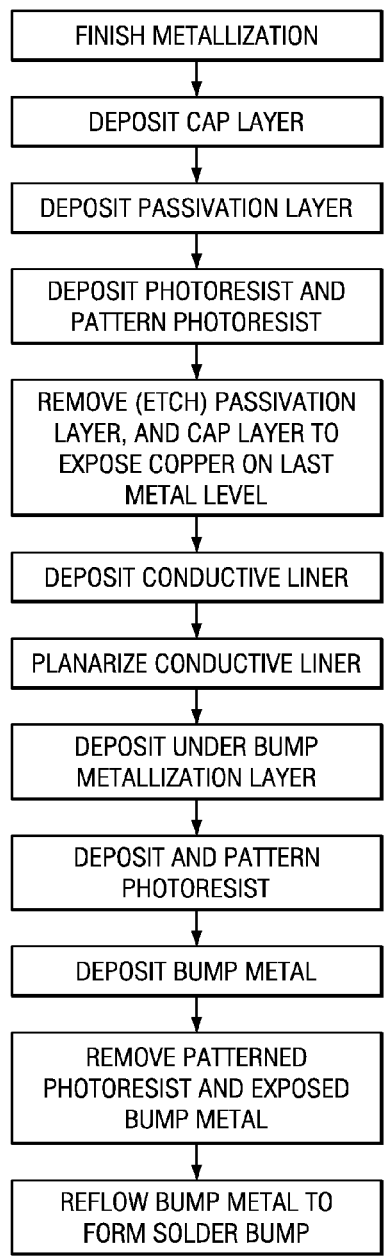
FIG. 4 illustrates a flow chart of a method of formation of the flip chip package, in accordance with an embodiment of the invention illustrated in FIG. 3.

A method of fabricating the flip chip package is now described in FIG. 3 and in the flow chart of FIG. 4, in accordance with an embodiment of the invention. Referring to FIG. 3a, a cap layer 120 is deposited over the last metal line 100 and dielectric layer 10. The last metal line 100 is the top most level of the metallization on the substrate 1 (lower metal levels are not shown). The substrate 1 (e.g., a silicon wafer) includes active circuitry as well as necessary features such as isolation regions. The last metal line 100 preferably comprises copper. The dielectric layer 10 preferably comprises an oxide or any other suitable materials. For example, the dielectric layer 10 may comprise FTEOS, SiN, SiCOH, or other low-k materials. The cap layer 120 is typically a nitride, although other suitable materials (such as SiCHN, e.g., N-Blok™ from Applied Materials) may be deposited in other embodiments. A passivation layer 130 is deposited over the cap layer 120. The passivation layer 130 is typically an oxide layer. In other embodiments, the passivation layer 130 may comprise FTEOS, SiN, SiCOH, or other low-k materials. An insulating liner 140 is disposed above the passivation layer 130. The optional insulating liner 140 preferably comprises a nitride layer. In various embodiments, the optional insulating liner 140 may comprise FTEOS, SiO2, SiCOH, or other low-k materials. The cap layer 120, the passivation layer 130 and insulating liner 140 form a protective layer over the last metal line 100, and prevent environmental degradation of copper and active circuitry.

A layer of photoresist is deposited over the optional insulating liner 140 (not shown). The photoresist is exposed and etched to form a mask layer. Using the photoresist mask layer, the optional insulating liner 140, passivation layer 130, and the cap layer 120 are etched to open a trench 150 (or a via) (FIG. 3b). A suitable chemistry is chosen to form the trench with tapering sidewalls as illustrated in FIG. 3b. The angle of the trench α is chosen to be between about 30° and about 90°.

Referring to FIG. 3c, a conductive liner 160 is deposited over the trench 150 and over the optional insulating liner 140. A planarising process such as a chemical mechanical polish (CMP) is used to remove the conductive liner 160 from over the optional insulating liner 140 (or over the passivation layer 130) (FIG. 3d). The conductive liner 160 is a diffusion barrier metal and prevents out-diffusion of copper from the last metal line 100 as well as any intermixing with further metallic layers. The conductive liner 160 preferably comprises TiN. In various embodiments, the conductive liner 160 is selected from a group comprising TiN, Ti/TiN, Ta, Ta/TaN, Al, Al/Cu and their combinations. In other embodiments, any other suitable metallic liner materials or their compositions may be used. The conductive liner 160 may be deposited by a suitable deposition process such as PVD, sputtering, CVD, or ALD.

As illustrated in FIG. 3e, an under bump metallization layer 170 is deposited on the trench 150. The UBM layer 170 comprises multiple layers, although in some embodiments a single layer may be used. This UBM layer 170 provides a strong, stable, low resistance electrical connection to the conductive liner 160. It adheres well to the underlying conductive liner 160. The UBM layer 170 also provides a strong barrier to prevent the diffusion of other bump metals into the IC. The UBM layer 170 is also readily wettable by the bump metals, for solder reflow. Hence, the UBM layer 170 typically comprises multiple layers of different metals, such as an adhesion layer, a diffusion barrier layer, and a solderable layer. The UBM layer 170 may be deposited by electroplating, sputtering, or deposited by any other suitable process. The UMB layer 170 preferably comprises a Ti/Cu/Ni layer. In various embodiments, the deposition of UBM layer 170 may comprise deposition of layers of Ti, Cu, Ni, Cr, Cr—Cu, Ni—V, Ti—Cu, Ti—W, Au, or Ni—Au.

A photo resist layer 180 is deposited over the UBM layer 170, as illustrated in FIG. 3f. The photo resist layer 180 is patterned using a lithographic process to expose a region above the trench 150. A bump metal 190 is deposited over the UBM layer 170, covering the trench 150. The bump metal 190 is preferably electroplated onto a seed layer on the UBM layer 170, although, in other embodiments, other processes such as electroless plating or deposition processes such as vapor deposition may also be used. The bump metal 190 may be a single layer or comprise multiple layers with different compositions. For example, in one embodiment, the bump metal 190 comprises a lead (Pb) layer followed by a tin (Sn) layer. In another embodiment, an Sn/Ag layer may be deposited as the bump metal 190. Other examples include SnPbAg, SnPb, PbAg, PbIn, and lead free materials such as SnBi, SnAgCu, SnTn, and SiZn. In various embodiments, other suitable materials may be deposited.

Referring to FIG. 3g, the photo resist layer 180 is removed along with removal of the exposed UBM layer 170 (FIG. 3h). As next illustrated in FIG. 3i, the substrate is heated to reflow the bump metal 190 and the heating forms a solder bump 191 over the UBM layer 170. After reflow, a homogeneous solder bump 191 is formed. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, a lead free solder bump may be formed that comprises a composition of 97.5 Sn/2.6 Ag (97.5/2.5). The solder bump 191 comprises a homogeneous material and has a well defined melting temperature. For example, the high melting Pb/Sn alloys are reliable bump metallurgies which are particularly resistant to material fatigue. The UBM layer 170 may also diffuse and intermix. However, the conductive liner 160 is stable during heating and protects the inter diffusion of metal atoms into and from the last metal line 100.

In a different embodiment, a flip chip package is formed after the removal of the exposed UBM layer 170, as described in FIG. 3h, the substrate 1 (wafer) is diced to form semiconductor chips 3, as shown in FIG. 3j. The individual semiconductor chips 3 with the solder bump 191 are next flipped over and bonded to a carrier 2 such as a PC board (FIG. 3j). The carrier 2 may be a circuit board or any suitable substrate. The bonding may be performed by a reflow of the solder bump 190 (FIG. 3k). An under-fill layer 106 between the carrier 2 and the chips 3 is added to reduce the stress in the solder bump 191 and for supporting the structure.

Figure 6:
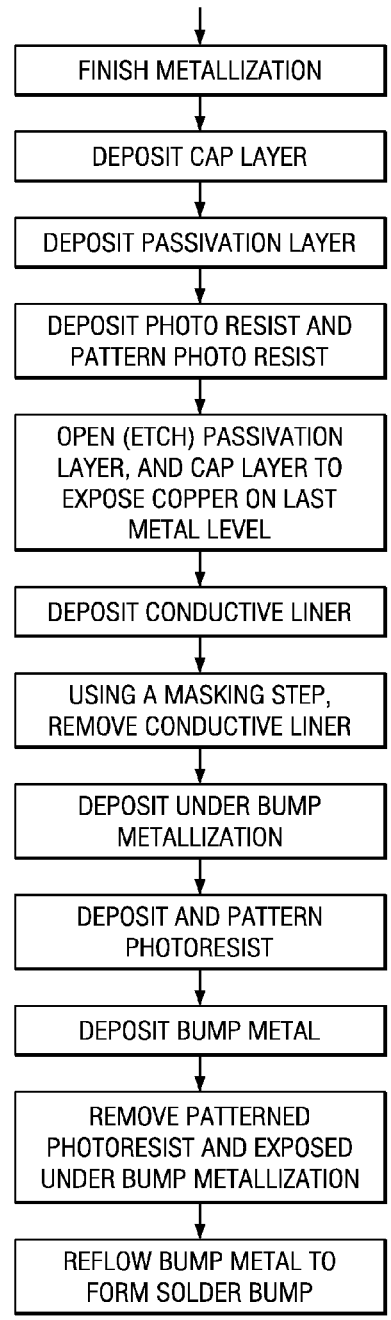
FIG. 6 illustrates a flow chart of a method of formation of the flip chip package, in accordance with an embodiment of the invention illustrated in FIG. 5.

An embodiment of the invention for manufacturing the package is next described using FIG. 5 and the flow chart of FIG. 6.

Figure 5A:
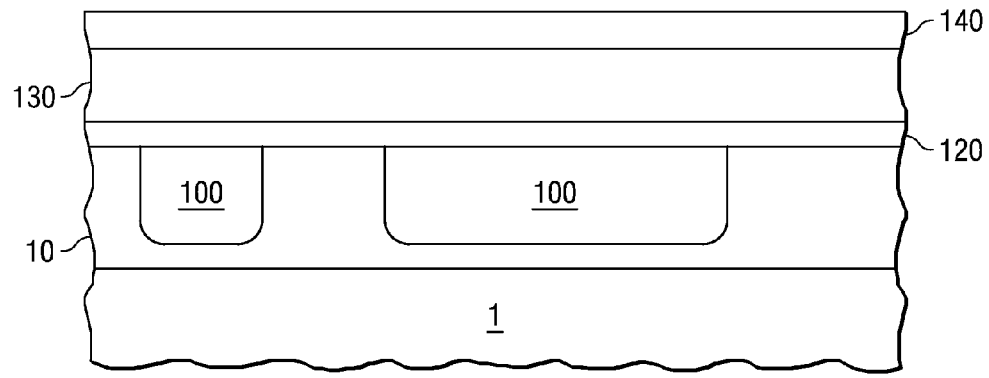
FIGS. 5a-5g, illustrates a flip chip package at various stages of fabrication, in accordance with an embodiment of the present invention.
Figure 5B:
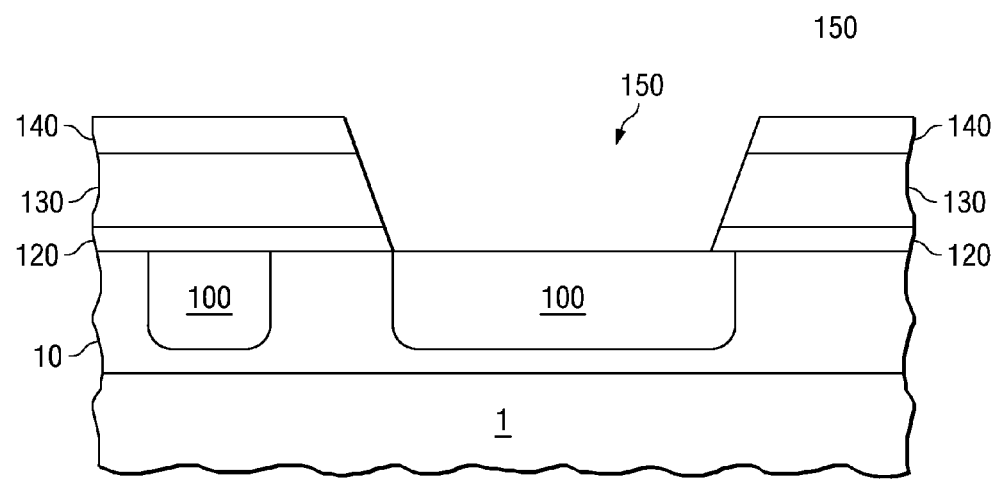
Figure 5C:
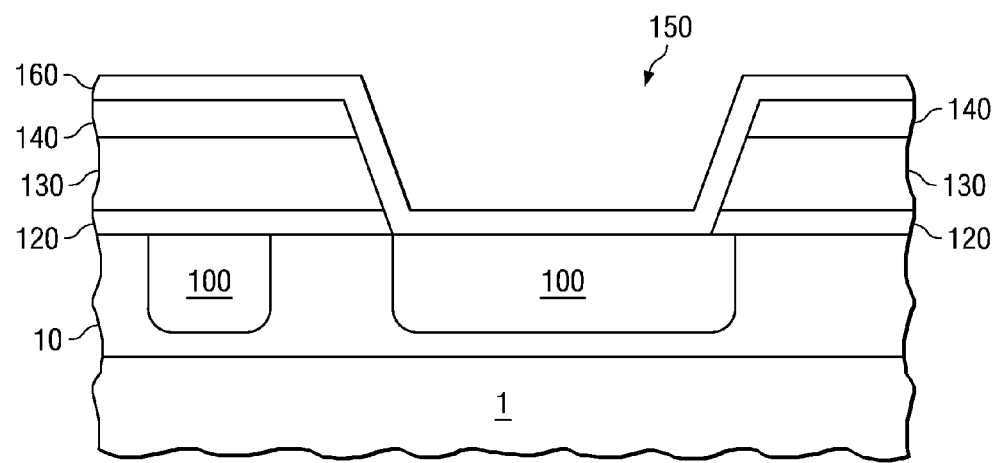
Figure 5D:
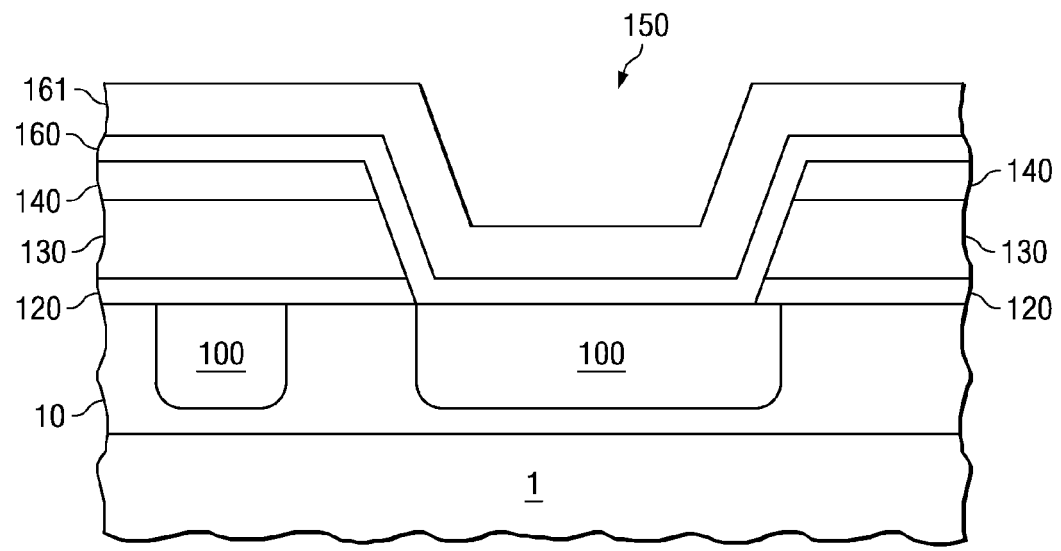
Figure 5E:
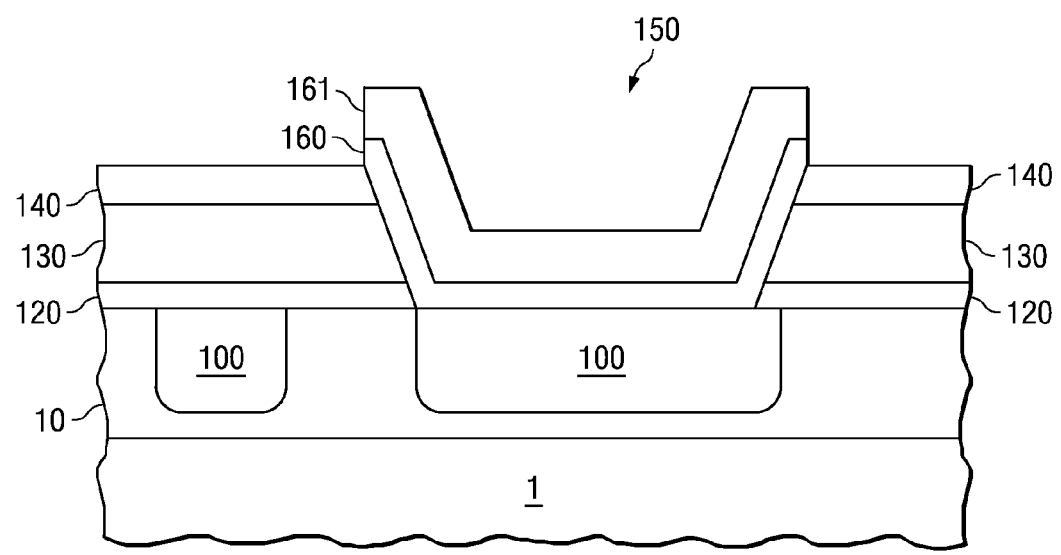
Figure 5F:
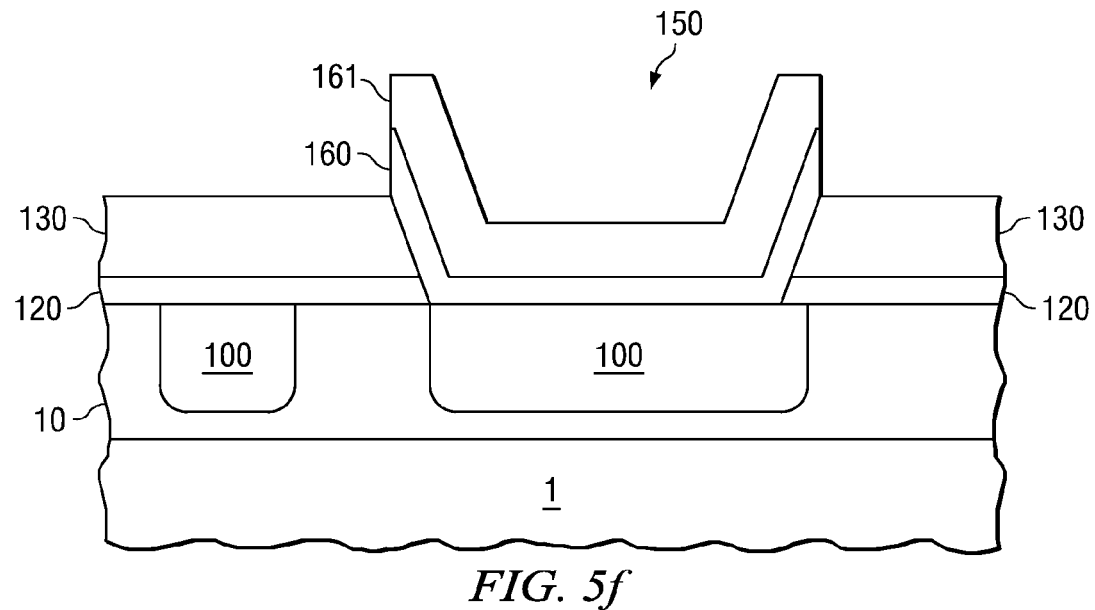
Figure 5G:
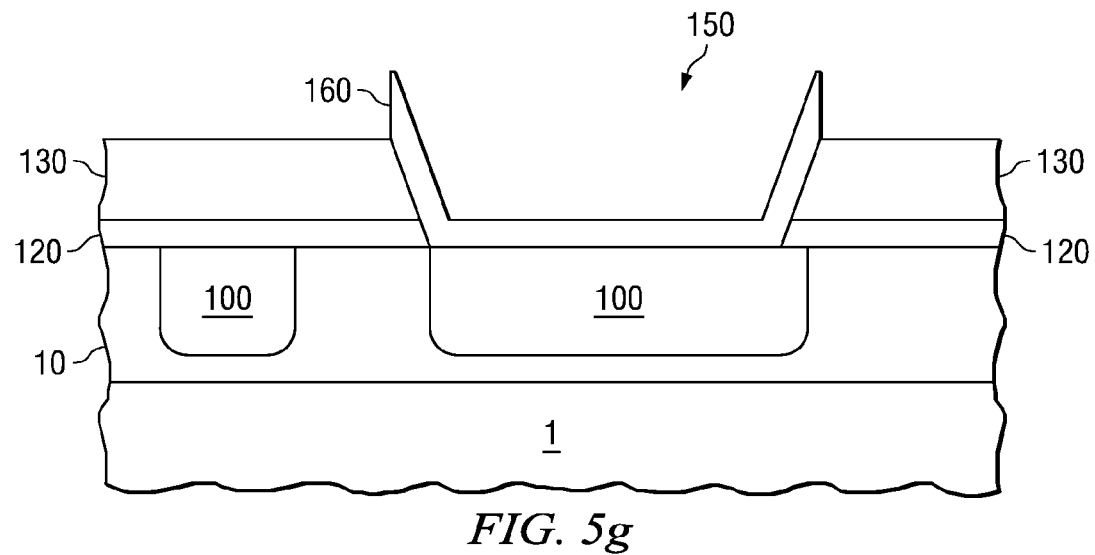

As illustrated in FIGS. 5a-5c, the method follows the method described in FIGS. 3a-3c. Hence, a trench 150 is formed with a conductive liner 160. A trench 150 is formed on the stack formed by the cap layer 120, the passivation layer 130, and the optional insulating liner 140. A conductive liner 160 is disposed above and on the last metal line 100. The conductive liner 160 also is disposed on the sidewalls of the trench 150. A resist layer 161 is deposited over the conductive liner 160 (FIG. 5d). As illustrated in FIG. 5e, the resist layer 161 is patterned to expose the conductive liner 160. The exposed portion of the conductive liner 160 is etched away. As next illustrated in FIG. 5f, the exposed portion of the optional insulating liner 140 is also etched away. The patterned photo resist layer is etched and removed (FIG. 5g). Subsequent processing follows the steps described in FIGS. 3e-3i.

Although embodiments of the present invention are explained for flip chip packages, the embodiments of the invention apply to other packages, in particular to wire bonding, wafer level, and embedded wafer level packages.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor component, the method comprising:
    forming a cap layer over a last metal line of an inter level dielectric layer;
    forming an intermediate insulating layer over the cap layer;
    forming an uppermost insulating layer over the intermediate insulating layer;
    forming an opening in the cap layer, the intermediate insulating layer and the uppermost insulating layer, wherein the opening exposes a portion of the last metal line, and wherein the opening comprises a sidewall;
    forming a conductive liner on the exposed portion of the last metal line and the sidewall of the opening;
    depositing an under bump metallization layer over the conductive liner, wherein depositing the under bump metallization layer comprises depositing multiple layers, and wherein depositing the under bump metallization layer comprises depositing layers comprising Ti/Cu/Ni; and
    forming a solder bump on the under bump metallization layer and in the opening.

2. The method of claim 1, wherein forming the conductive liner comprises:
    depositing the conductive liner on the opening and over the uppermost layer; and
    planarizing the conductive liner thereby removing the conductive liner from over the uppermost layer.

3. The method of claim 1, wherein forming the conductive liner comprises:
    depositing the conductive liner on the opening and over the uppermost layer; and
    depositing and patterning a photoresist layer; and
    using the patterned photo resist as a mask to remove the conductive liner from over the uppermost layer.

4. The method of claim 1, wherein the last metal line comprises copper.

5. The method of claim 4, wherein the conductive liner is selected from the group consisting of Ti/TiN and Ta/TaN.

6. The method of claim 4, wherein the conductive liner is selected from the group consisting of TiN, TaN, Ta, W and Al/Cu.

7. A method for forming a semiconductor component, the method comprising:
    forming a nitride layer over a last copper line of an inter level dielectric layer;
    forming an oxide layer over the nitride layer;
    forming an uppermost insulating layer over the nitride layer;
    forming an opening in the uppermost insulating layer, the nitride layer and the oxide layer, wherein the opening exposes a portion of the last copper line, and wherein the opening comprises a sidewall;
    forming a conductive liner on the exposed portion of the last copper line and the height of the sidewall of the opening;
    depositing an under bump metallization layer over the conductive liner, wherein depositing the under bump metallization layer comprises depositing multiple layers, and wherein depositing the under bump metallization layer comprises depositing layers comprising Ti/Cu/Ni; and depositing a solder metal over the under bump metallization layer and in the opening.

8. The method of claim 7, wherein the conductive liner is selected from the group consisting of Ti/TiN and Ta/TaN.

9. The method of claim 7, wherein the conductive liner is selected from the group consisting of TiN and TaN.

10. The method of claim 7, wherein the conductive liner is selected from the group consisting of Ta, W and Al/Cu.

11. The method of claim 7, wherein the under bump metallization layer is selected from the group consisting of Ti, Cu, Ni, Au and Cr.

12. The method of claim 7, wherein the under bump metallization layer further comprises a layer selected from the group consisting of Cr—Cu and Ni—V.

13. The method of claim 7, wherein the under bump metallization layer further comprises a layer selected from the group consisting of Ti—Cu, Ti—W and Ni—Au.

14. A method for forming a semiconductor component, the method comprising:

forming a nitride layer directly over a last copper line of an inter level dielectric layer;

forming an oxide layer directly over the nitride layer;

forming an uppermost insulating layer directly over the nitride layer;

forming an opening in the uppermost insulating layer, the nitride layer and the oxide layer, wherein the opening exposes a portion of the last copper line, and wherein the opening comprises a sidewall;

forming a conductive liner directly on the exposed portion of the last copper line and the sidewall of the opening;

depositing an under bump metallization layer directly over the conductive liner, wherein depositing the under bump metallization layer comprises depositing multiple layers, and wherein depositing the under bump metallization layer comprises depositing layers comprising Ti/Cu/Ni; and depositing a solder metal directly on the under bump metallization layer and in the opening.

15. The method of claim 14, wherein the conductive liner is selected from the group consisting of Ti/TiN and Ta/TaN.

16. The method of claim 14, wherein the conductive liner is selected from the group consisting of TiN and TaN.

17. The method of claim 14, wherein the under bump metallization layer further comprises a layer selected from the group consisting of Cr—Cu and Ni—V.

18. The method of claim 14, wherein the under bump metallization layer further comprises a layer selected from the group consisting of Ti—Cu, Ti—W and Ni—Au.

* * * * *